United States Patent [19]
Singh et al.

[11] Patent Number: 5,721,445
[45] Date of Patent: Feb. 24, 1998

[54] SEMICONDUCTOR DEVICE WITH INCREASED PARASITIC EMITTER RESISTANCE AND IMPROVED LATCH-UP IMMUNITY

[75] Inventors: Ranbir Singh, Macungie, Pa.; Morgan Jones Thoma, Orlando, Fla.

[73] Assignee: Lucent Technologies Inc., Murray Hill, N.J.

[21] Appl. No.: 397,346

[22] Filed: Mar. 2, 1995

[51] Int. Cl.$^6$ .......................... H01L 29/78; H01L 27/02; H01L 29/72
[52] U.S. Cl. .................. 257/369; 257/372; 257/377; 257/380; 257/385; 257/370; 257/903; 257/401
[58] Field of Search ...................... 257/369, 372, 257/377, 379, 380–382, 385, 401, 386, 370, 378, 903

[56] References Cited

U.S. PATENT DOCUMENTS

| | | | |
|---|---|---|---|
| 4,622,573 | 11/1986 | Bakeman, Jr. et al. | 257/338 |
| 4,762,802 | 8/1988 | Parrillo | 437/24 |
| 4,805,008 | 2/1989 | Yao et al. | 257/376 |
| 4,893,157 | 1/1990 | Miyazawa et al. | 257/360 |
| 4,922,317 | 5/1990 | Mihara | 257/372 |
| 4,931,850 | 6/1990 | Yamada | 257/400 |
| 5,006,477 | 4/1991 | Farb | 437/34 |
| 5,045,900 | 9/1991 | Tamagawa | 257/338 |
| 5,128,738 | 7/1992 | Lee et al. | 257/324 |
| 5,142,641 | 8/1992 | Fujioka | 257/361 |
| 5,159,204 | 10/1992 | Bernacchi et al. | 257/372 |
| 5,159,518 | 10/1992 | Roy | 257/357 |
| 5,304,833 | 4/1994 | Shigeki et al. | 257/369 |
| 5,334,541 | 8/1994 | Adams et al. | 437/8 |
| 5,338,986 | 8/1994 | Kurimoto | 257/372 |
| 5,350,939 | 9/1994 | Honda et al. | 257/378 |
| 5,455,436 | 10/1995 | Cheng | 257/356 |
| 5,488,248 | 1/1996 | Lee et al. | 257/401 |
| 5,521,860 | 5/1996 | Ohkubo | 257/369 |

FOREIGN PATENT DOCUMENTS 0010465  1/1992  Japan ..................... 257/369

OTHER PUBLICATIONS

Ochoa, A., and Dawes, W., "Latch–up Control in CMOS Integrated Circuits," IEEE Transactions on Nuclear Science, vol. NS–26, No. 6, Dec. 1979, pp. 5065–5068.

Shiono, N., et al., "A 64K SRAM with High Immunity from Heavy Ion Induced Latch–up," IEEE Electron Device Letters, vol. EDL–7, No. 1, Jan. 1986, pp. 20–22.

Primary Examiner—Wael Fahmy
Assistant Examiner—Alexander Oscar Williams
Attorney, Agent, or Firm—John T. Rehberg

[57] ABSTRACT

An apparatus and method for providing improved latch-up immunity in a semiconductor device such as a complementary metal-oxide-semiconductor (CMOS) integrated circuit. An exemplary apparatus includes a first region of semiconductor material of a first conductivity type, a well of semiconductor material formed in the first region and having a second conductivity type opposite to the first conductivity type, a first MOS transistor formed in the well and including a source region and a drain region formed of semiconductor material of the first conductivity type, and a second MOS transistor formed in the first region and having a source region and a drain region formed of semiconductor material of the second conductivity type. A conductive material or other suitable routing means is connected between the source region of one of the first or second MOS transistors and a corresponding voltage supply input of the device. In one embodiment, the routing means is formed of a semiconductor material having the same conductivity type as the source region, and may be a $P^+$ or $N^+$ active region. The source region of the first and/or second MOS transistor may be formed from a portion of the routing means.

20 Claims, 3 Drawing Sheets

SEMICONDUCTOR DEVICE WITH INCREASED PARASITIC EMITTER RESISTANCE AND IMPROVED LATCH-UP IMMUNITY

FIELD OF THE INVENTION

The present invention relates generally to improvements in latch-up immunity in semiconductor devices. More particularly, the present invention relates to complementary metal-oxide-semiconductor (CMOS) devices which include parasitic bipolar transistors and to techniques for improving the latch-up immunity of the CMOS devices by increasing the effective emitter resistance of a parasitic bipolar transistor.

BACKGROUND OF THE INVENTION

Complementary metal-oxide-semiconductor (CMOS) devices are often susceptible to an effect known as latch-up. Latch-up refers generally to a self-sustaining, low-impedance condition resulting from the combined action of parasitic pnp and npn bipolar transistors inherent in the CMOS structure. The action of the parasitic bipolar transistors is often likened to that of a thyristor or silicon-controlled rectifier (SCR). The resulting low-impedance condition may permanently damage the CMOS device by causing excessive current flow which damages metallization and/or internal junctions, or may cause a loss of stored data by altering an internal operating state of the device. Latch-up can be triggered, for example, by an electrostatic discharge (ESD) voltage spike inadvertently applied to the device during handling, or by exposure of the device to cosmic or other ionized radiation in its operating environment. Additional detail regarding latch-up in CMOS devices can be found in, for example, U.S. Pat. No. 4,762,802 which is assigned to the assignee of the present invention, and A. Ochoa et al., "Latch-up Control in CMOS integrated Circuits," IEEE Transactions on Nuclear Science, Vol. NS-26, No. 6, December 1979, both of which are incorporated by reference herein.

Semiconductor devices are often specified in terms of a resistance to latch-up or other single-event errors at a predetermined radiation level. For example, those devices which are used in space-based electronics systems such as communication satellites are required to have a very high immunity to radiation-induced latch-up. Similar concerns apply in other electronics systems requiring high reliability, including defense and avionics systems. MOS and CMOS devices are among the semiconductor devices most susceptible to latch-up as a result of the above-noted parasitic bipolar transistors inherent in their structure. Nonetheless, MOS and CMOS devices are commonly used as electronic memory components in static random-access memory (SRAM) and dynamic random access memory (DRAM), as well as in numerous other applications. In these and other very large scale integrated (VLSI) circuits, there is a continuing effort to increase circuit packing density by reducing the dimensions of transistors and other devices. Unfortunately, the substantially reduced device dimensions in presently-available VLSI CMOS circuits can increase susceptibility to latch-up.

An exemplary technique for providing increased latch-up immunity in a CMOS-based SRAM is described in N. Shiono et al., "A 64K SRAM with High Immunity from Heavy Ion Induced Latch-Up," IEEE Electron Device Letters, Vol. EDL-7, No. 1, January 1986, which is incorporated by reference herein. This technique utilizes a well-source structure in which a $P^+$ source junction of a p-channel MOS field-effect transistor (FET) receives its positive voltage supply $V_{DD}$ through an n-well region rather than through direct connection to the supply voltage. The pn junction between the emitter and base of the parasitic pnp transistor in the device is thus less likely to become forward biased, and thereby create the low-impedance latch-up condition, because the potential of the parasitic pnp emitter is generally maintained at or below that of the base. Although this approach can reduce latch-up in certain applications, it suffers from a number of disadvantages. For example, the sheet resistance in the n-well is very high, typically on the order of 1K to 3K ohms/square. In an SRAM device, this high n-well sheet resistance can significantly degrade SRAM performance as the length of a memory word is increased. The high n-well resistance may also make it difficult to control the amount of additional parasitic emitter resistance provided by routing the $V_{DD}$ supply input through the n-well. Furthermore, the n-well technique may be hard to implement in many practical applications due to the difficulty of aligning different doping levels as well as a number of other concerns.

U.S. Pat. No. 5,338,986 discloses a latch-up resistant CMOS output circuit in which a resistive component is arranged in at least one of the sources of a p-channel and an n-channel FET. The resistive component limits the collector current of a parasitic bipolar transistor and thereby reduces the likelihood of latch-up. The resistive component is implemented using asymmetrical source-gate and drain-gate contact spacing in the device layout and/or a reduced number of contacts between the supply metallization and the source regions relative to the number of contacts used for the drain regions. Although this technique serves to increase the emitter resistance of the parasitic pnp transistor, it also suffers from a number of significant drawbacks. For example, constraints on overall chip area in many applications will limit the degree to which the source-gate and drain-gate contact spacing can be varied. Also, varying the number of contacts in the source will often add only a relatively small resistance to the parasitic emitter, since many designs already attempt to minimize the contact resistance between the metallization and the active areas. Furthermore, this approach is not well-suited for use in SRAM applications, in which both the number of contact windows and the gate to contact spacing are generally minimized.

A number of other techniques have also been used to improve latch-up immunity in CMOS devices. These include minority carrier lifetime control methods such as gold doping and neutron irradiation, as well as the use of buried layers to modify the base transport factor in one or both of the parasitic transistors. However, these techniques are often incompatible with the above-noted goal of substantially reduced device dimensions. In addition, techniques which reduce minority carrier lifetime through addition of impurities or irradiation can degrade the gate oxide in a MOS device. Also, adding buried layers is generally an expensive proposition and can cause defects which reduce device yield.

As is apparent from the above, a need exists for a semiconductor device which exhibits increased immunity to latch-up without significantly altering device layout or unduly limiting achievable device dimensions.

SUMMARY OF THE INVENTION

The present invention involves increasing the parasitic emitter resistance in a semiconductor device in such a manner that the immunity to latch-up is improved without adversely impacting the layout or minimum dimensions of the device. The invention is particularly well-suited to CMOS SRAM applications, in that the amount of parasitic emitter resistance provided can be easily and accurately scaled to accommodate SRAM devices with long word lines. One aspect of the invention is directed to a semiconductor device which includes a first region of semiconductor material of a first conductivity type, a well of semiconductor material formed in the first region and having a second conductivity type opposite to the first conductivity type, a first transistor formed in the well and including a source region and a drain region formed of semiconductor material of the first conductivity type, a second transistor formed in the first region and having a source region and a drain region formed of semiconductor material of the second conductivity type; and routing means connected between the source region of at least one of the first and second transistors and a voltage input of the device, wherein the routing means is formed of a semiconductor material having the same conductivity type as the source region. The routing means may be, for example, a $P^+$ or $N^+$ active semiconductor region, also referred to herein as a thinox region, and the source region of the first or second transistor may be formed from a portion of the routing means. The routing means effectively provides an additional resistance in series with the emitter of a parasitic transistor in the semiconductor device. Unlike prior art latch-up prevention techniques, the increased emitter resistance of the present invention is easily controllable and can be readily scaled to provide increased immunity in memory devices with long word lengths.

The present invention provides improved latch-up immunity in CMOS and other semiconductor devices by making it more difficult for parasitic transistors in the device structure to enter active regions of operation. The immunity is provided by, for example, routing a $V_{DD}$ or $V_{SS}$ supply voltage to the device through a region of semiconductor material which provides a suitable amount of additional resistance. The invention does not impose significant restraints on device layout or dimensions and is inexpensive and simple to implement. Furthermore, a significant advantage of the present invention is that, by routing a supply voltage through an active region which has a relatively low sheet resistance, the number of cells which can be included in a CMOS memory device is substantially increased.

The above-discussed features, as well as additional features and advantages of the present invention, will become apparent by reference to the following detailed description and accompanying drawings.

DETAILED DESCRIPTION

Although the following description illustrates the present invention primarily in terms of an exemplary complementary metal-oxide-semiconductor (CMOS) device, it should be understood that the invention is also suitable for use with a variety of other semiconductor devices. For example, the invention can be utilized in numerous other MOS or CMOS devices as well as other types of devices which include field effect transistors (FETs). In addition, although the invention is particularly well-suited to reduce susceptibility to latch-up, the techniques disclosed can also be used to alleviate other undesirable effects attributable to the operation of parasitic elements in semiconductor devices.

Figure 1:
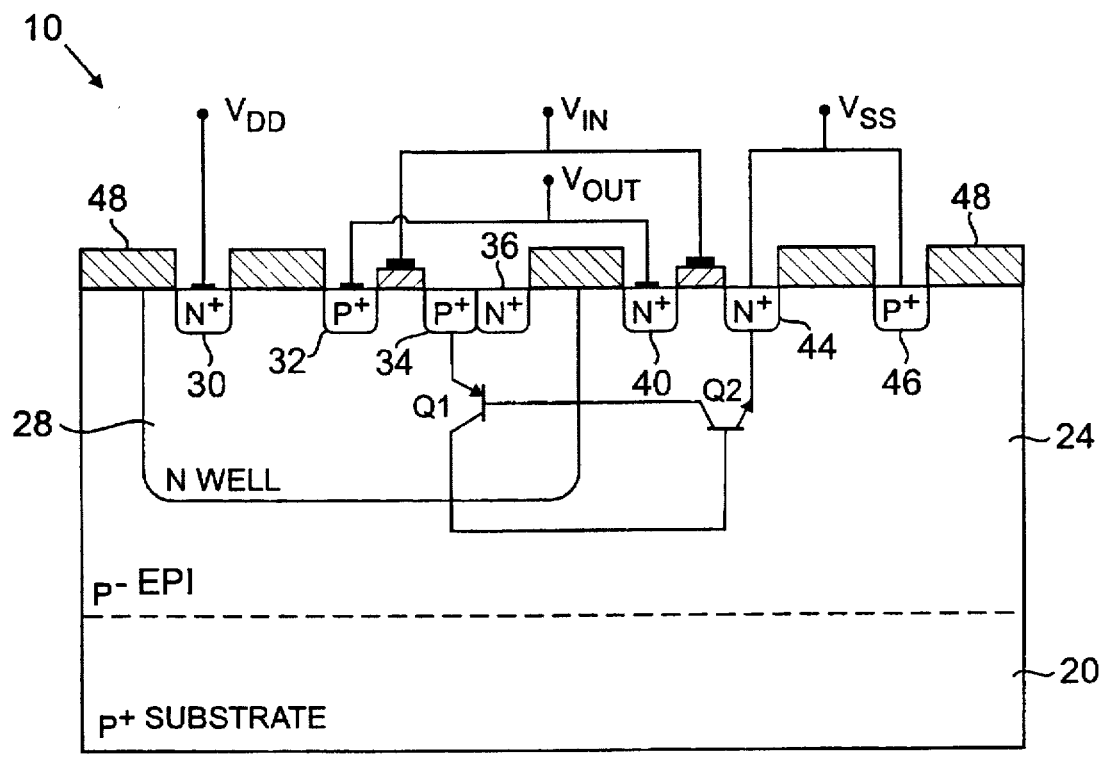
FIG. 1 shows a side cross-sectional diagram of a CMOS semiconductor device with latch-up immunity in accordance with the prior art.

FIG. 1 shows a cross-sectional view of an exemplary CMOS semiconductor device 10 in accordance with the prior art. The exemplary CMOS device 10 is configured to operate as an inverter and incorporates both a p-channel FET and an n-channel FET. Device 10 includes a substrate 20 comprising a $P^+$ type semiconductor material. An epitaxial layer 24 is grown on top of the substrate 20 and in this example comprises a $P^-$ type semiconductor material. An n-well 28 is arranged within the epitaxial layer 24. The n-well 28 includes a number of regions 30, 32, 34 and 36 which are suitably doped to comprise $N^+$, $P^+$, $P^+$ and $N^+$ type semiconductor material, respectively. Region 30 is directly connected to a supply voltage input $V_{DD}$. The voltage input $V_{DD}$ may be connected to an external power supply (not shown) which supplies power to the device 10. Regions 32 and 34 represent the drain and source, respectively, of the p-channel FET within device 10. The gate of the p-channel FET is connected to a line designated $V_{IN}$. The output of the p-channel FET is represented by a line $V_{OUT}$ and is connected to drain region 32.

The epitaxial layer 24 also includes a number of regions 40, 44 and 46 which are suitably doped to comprise $N^+$, $N^+$ and $P^+$ semiconductor material, respectively. Regions 40, 44 represent the drain and source, respectively, of the n-channel FET in device 10. The gate of the n-channel FET is also connected to $V_{IN}$ and to the gate of the p-channel FET. The drain 40 of the n-channel FET is connected to $V_{OUT}$ and to the source 32 of the p-channel FET. Regions 44 and 46 are connected to a supply voltage input $V_{SS}$ which is generally connected to a lower level voltage supply than $V_{DD}$. Although a typical embodiment utilizes $V_{DD}$ at about five volts and $V_{SS}$ at ground potential, these supply voltages may take on any number of other values in alternative embodiments. An oxide layer 48 is disposed over the semiconductor regions and suitably etched to permit connection to lines $V_{IN}$, $V_{OUT}$, $V_{DD}$ and $V_{SS}$.

In operation, a signal applied to line $V_{IN}$ at a logic high voltage level will cause the n-channel FET to turn on, thereby creating an n-type conduction channel between regions 40 and 44 of the n-channel FET. At the same time, the p-channel FET is turned off, such that substantially no current flows between regions 32 and 34 of the p-channel FET. The output line $V_{OUT}$ connected to regions 32 and 40 is therefore pulled to the lower supply voltage $V_{SS}$ through the n-channel FET. The device 10 has thus inverted the input logic high voltage level to an output logic low voltage level. A signal applied to the line $V_{IN}$ at a logic low voltage level will turn off the n-channel FET and turn on the p-channel FET such that output line $V_{OUT}$ is connected through the p-channel FET to the supply voltage $V_{DD}$, providing a logic high level output signal. The operation of the p-channel and n-channel FETs is well-known and will not be further described herein.

As shown in FIG. 1, the internal structure of the CMOS device 10 includes two parasitic bipolar transistors Q1 and Q2. Transistor Q1 is a pnp parasitic bipolar with the region 32 forming its emitter, the n-well 28 forming its base and the P⁻ epitaxial layer forming its collector. Transistor Q2 is an npn parasitic bipolar with region 44 forming its emitter, the P⁻ epitaxial layer forming its base and the n-well 28 forming its collector.

Figure 2:
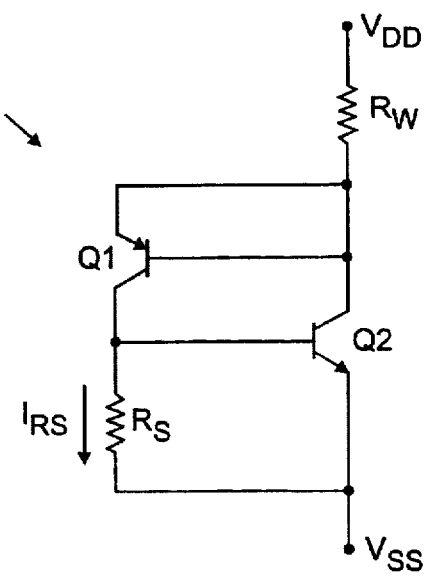
FIG. 2 is a schematic diagram illustrating the interconnection of parasitic elements Q1 and Q2 shown in the CMOS device of FIG. 1.

FIG. 2 illustrates an equivalent circuit 50 of a portion of the prior art device 10 which includes the two parasitic bipolar transistors Q1 and Q2. The equivalent circuit 50 also includes supply voltages $V_{DD}$ and $V_{SS}$. A resistor $R_W$ represents the resistance of the n-well region 28 between voltage $V_{DD}$ and P⁺ region 32. The P⁺ region 32, the n-well 28 and the P⁺ region 34 form the parasitic pnp bipolar transistor Q1. The N⁺ region P⁻ epitaxial layer 24 and N⁺ region 44 form the parasitic npn bipolar transistor Q2. A resistor $R_S$ connected between the base and emitter of Q2 represents the resistance of epitaxial layer 24 between n-well 28 and $V_{SS}$. The operation of parasitic bipolar transistors Q1 and Q2 creates the potential for the latch-up problems noted above. In normal operation of device 10, both transistors Q1 and Q2 are off and the emitter-base pn junctions thereof conduct only a minimal leakage current. However, if the parasitic pnp bipolar Q1 is turned on and enters its active region of operation, the transistor Q2 will generally also be turned on if the product of $I_{RS}$ and $R_S$ is greater than about 0.6 volts. A short circuit condition is thus created between $V_{DD}$ and $V_{SS}$, and may allow excessive current flow which can permanently damage the device. Excessive current may, for example, melt the metallization at the supply voltage inputs or the signal input or output, and flow of the melted metallization can short out the device or otherwise permanently prevent the device from performing the desired inverting function.

Latch-up protection is provided in the prior art device 10 in part by routing the supply voltage $V_{DD}$ through the n-well 28 rather than connecting it directly to the source region 32 of the p-channel FET. This alternative routing technique removes the n-well resistance $R_W$ from its typical location across the base-emitter junction of Q1, such that the base-emitter junction is effectively shorted as shown in FIG. 2. Q1 is thereby prevented from entering its active region and causing latch-up in device 10. The CMOS device of FIG. 1 uses the epitaxial-substrate configuration shown to reduce substrate spreading resistance in order to further limit operation of the parasitic pnp. Additional detail regarding latch-up protection in the prior art device of FIG. 1 may be found in the above-cited article by N. Shiono et al. As previously noted, this prior art technique may result in a number of problems such as, for example, high n-well resistance limiting word length in a memory device, difficulty in controlling the value of $R_W$, as well as more complicated alignment and other implementation problems.

The present invention is directed to an alternative technique for providing latch-up immunity in a semiconductor device such as a CMOS inverter. One embodiment of the invention involves increasing the resistance between the $V_{DD}$ supply and the emitter of the parasitic pnp bipolar by routing $V_{DD}$ through an active semiconductor region, a portion of which forms the source of the p-channel FET.

Figure 3:
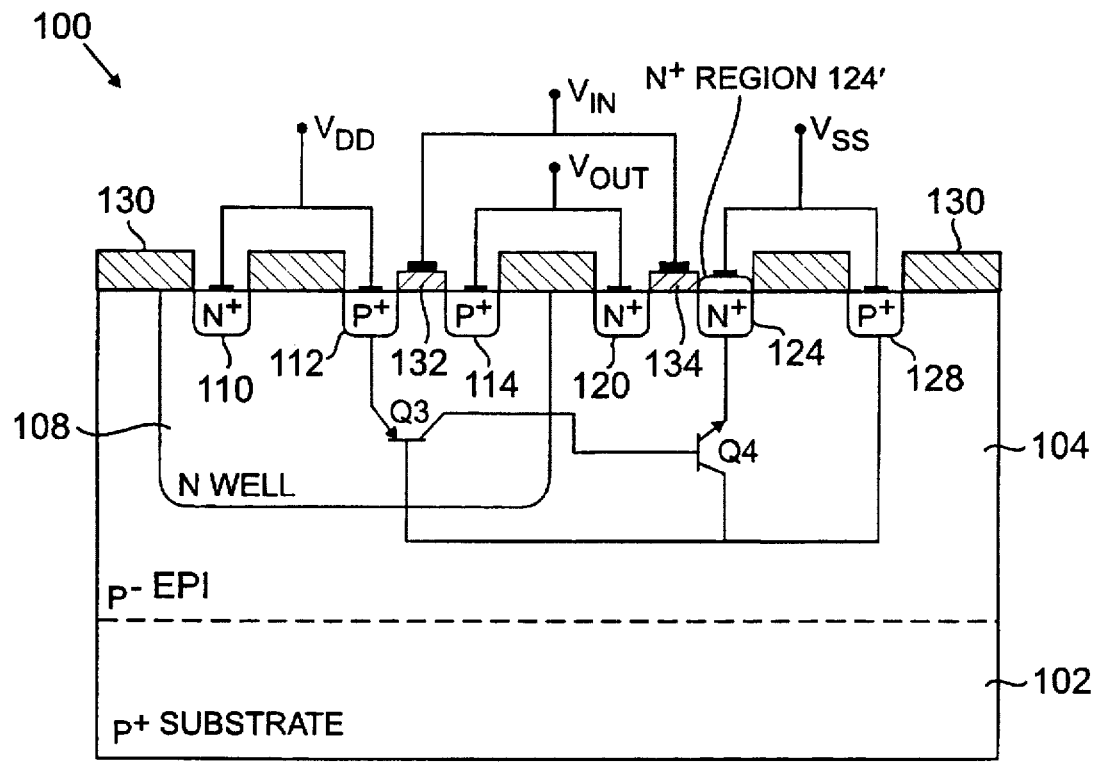
FIG. 3 shows a side cross-sectional diagram of a CMOS semiconductor device with latch-up immunity in accordance with the present invention.

FIG. 3 illustrates an exemplary CMOS device 100 in which the improved latch-up immunity of the present invention is implemented. The device 100 is configured and operates in a manner similar to device 10 described above. A P⁺ substrate 102 has a P⁻ epitaxial layer 104 formed thereon. An n-well 108 has regions 110, 112 and 114 formed therein, and regions 112 and 114 represent the source and drain, respectively, of a p-channel FET. Regions 120, 124 and 128 are formed in the P⁻ epitaxial layer 104, and regions 120 and 124 represent the drain and source, respectively, of an n-channel FET. An oxide layer 130 is formed over the semiconductor regions and is suitably etched to permit connection to $V_{DD}$, $V_{SS}$, $V_{IN}$ and $V_{OUT}$. The regions 132, 134 include a layer of polysilicon formed on top of the gate oxide for the p-channel and n-channel FETs, respectively. The device 100 operates as a conventional CMOS inverter in which the supply voltage $V_{DD}$ is connected directly to the P⁺ source region 112 of the p-channel FET. The lower supply voltage $V_{SS}$ may be connected directly to the N⁺ region of the source 124 of the n-channel FET similar to the connection of the supply voltage $V_{DD}$ to the P⁺ source region 112 of the p-channel FET, or it may be connected through an N⁺ region 124' having a first end connected to the supply voltage V and a second end in contact with the source region 124 of the n-channel FET. Parasitic pnp and npn transistors Q3 and Q4, respectively, can cause latch-up problems in a manner similar to that described above in connection with the parasitic transistors Q1 and Q2 of FIG. 1. It should be noted that the invention may be implemented without an epitaxial layer such as layer 104.

Figure 4:
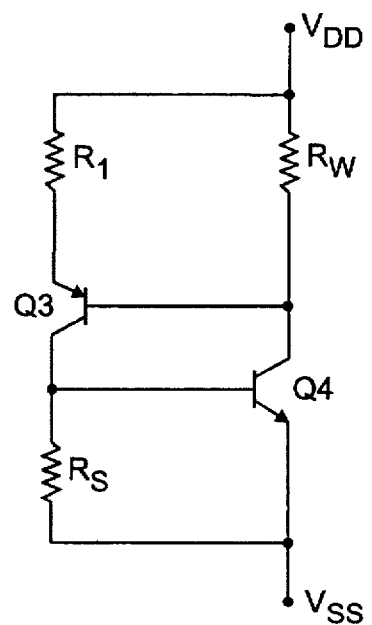
FIG. 4 is a schematic diagram illustrating the interconnection of parasitic elements Q3 and Q4 shown in the CMOS device of FIG. 3.

FIG. 4 illustrates a schematic diagram of parasitic elements in the device 100, and in which emitter resistance of the parasitic pnp transistor Q3 has been increased in accordance with the present invention. This exemplary embodiment of the present invention in effect provides an additional resistance R1 between the supply voltage $V_{DD}$ and the emitter of Q3. The resistance $R_W$ in this embodiment represents the resistance of the n-well 108 between the N⁺ region 110 and the P⁺ source region 112. The resistance $R_S$ represents the resistance of the P⁻ epitaxial layer 104 between the region 128 and the n-well 108. The additional resistance R1 limits the emitter-base voltage drop across Q3 and thereby makes it more difficult for Q3 to enter its active region and cause latch-up in device 100. Although this increased resistance between $V_{DD}$ and the source region of the p-channel device may limit operating speed in high-current applications, it generally does not adversely impact speed in low-current CMOS devices such as those typically used in, for example, static and dynamic random access memory (SRAM and DRAM) applications. Furthermore, as the number of cells in a memory device in accordance with the invention is increased, the additional parasitic emitter resistance R1 is increased, and latch-up immunity is further improved.

Figure 5:
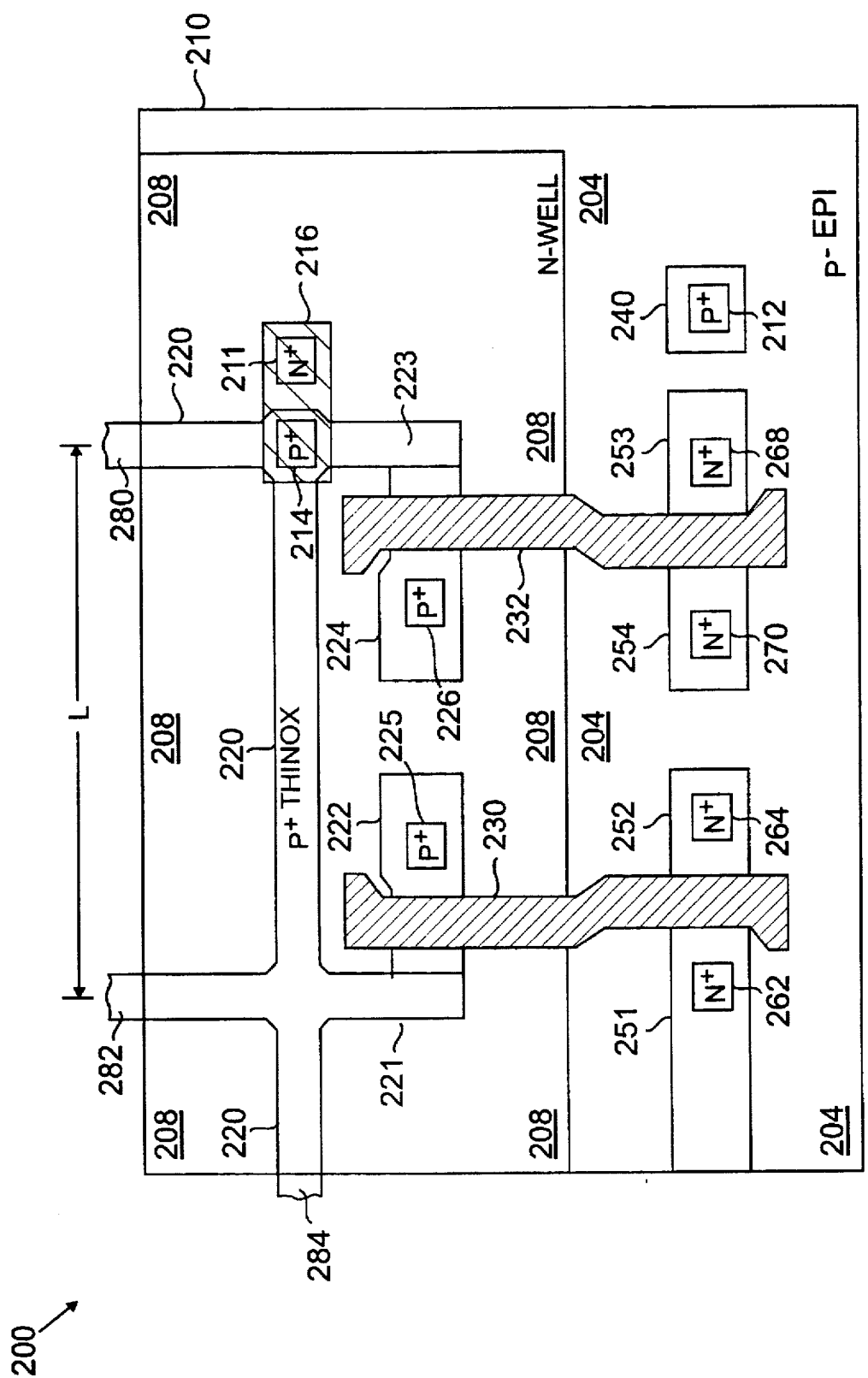
FIG. 5 is a top-down view of a portion of a CMOS integrated circuit, and illustrates an exemplary manner in which a parasitic emitter resistance can be increased in accordance with the present invention to provide improved latch-up immunity.

FIG. 5 shows a layout of a portion 210 of an exemplary CMOS integrated circuit 200 in accordance with the present invention. In this embodiment, the additional parasitic emitter resistance R1 is provided by routing the supply voltage $V_{DD}$ through a P⁺ semiconductor region 220, also referred to herein as a thinox region or an active region. It should be noted that the term "thinox" is intended herein to distinguish an active region such as region 220 from, for example, field oxide regions of the semiconductor device, and should not be construed as limiting the structure, dimensions, composition or layout of region 220. The region 220 is an exemplary routing means, and alternative routing means in accordance with the invention include, for example, N⁺ semiconductor regions, polysilicon regions, or other suitable conductive materials. The routing means is selected to provide a suitable resistivity on the order of, for example, about 50 to 100 ohms/square. The P⁺ thinox region 220 in this embodiment is connected between the supply voltage $V_{DD}$ and the P⁺ source region 112 of the p-channel FET. The exemplary layout in FIG. 5 illustrates this connection. The portion 210 of the exemplary CMOS integrated circuit device includes a P⁻ epitaxial layer 204 formed on an underlying substrate layer (not shown). An n-well 208 is formed in the epitaxial layer 204. A contact window 211 exposes an underlying N⁺ region in n-well 208 which corresponds to region 110 of FIG. 3 and is generally connected to the $V_{DD}$ supply. Another contact window 212 exposes an underlying P⁺ region which corresponds generally to the region 128 of FIG. 3 and is typically connected to $V_{SS}$. A contact window 214 exposes an underlying portion of the P⁺ thinox region 220. Metallization 216 provides a connection between $V_{DD}$ and the active regions underlying contact windows 211 and 214.

The P⁺ thinox region 220 is used in this embodiment to route the $V_{DD}$ supply voltage to the source regions of the p-channel FETs. Portions 221 and 223 of the P⁺ thinox region 220 each represent a source region, similar to region 112 of FIG. 3, of a corresponding p-channel FET. Regions 222 and 224 represent the drain regions of the corresponding p-channel FETs for which regions 221 and 223, respectively, serve as source regions. Contact windows 225 and 226 provide an opening through which the P⁺ drain regions 222 and 224, respectively, can be connected to $V_{OUT}$. Polysilicon regions 230 and 232 separate the P⁺ source regions 221, 223 from the P⁺ drain regions 222, 224, respectively.

The polysilicon regions 230, 232 also separate N⁺ source and drain regions of n-channel FETs in device 200. The regions 251, 252 represent N⁺ source and drain regions, respectively, of one n-channel FET in device 200, while regions 253, 254 represent N⁺ source and drain regions, respectively, of another n-channel FET. The N⁺ regions 251, 253 are therefore similar to region 120 of FIG. 3, and regions 252, 254 are similar to region 124 of FIG. 3. Contact windows 262, 264 permit connection of underlying regions 251, 252 to $V_{OUT}$ and $V_{SS}$, respectively. Contact windows 268, 270 permit connection of underlying regions 253, 254 to $V_{OUT}$ and $V_{SS}$, respectively.

The supply voltage $V_{DD}$ is routed through the P⁺ thinox region 220 to each of the P⁺ source regions in device 200. The P⁺ thinox region 220 thus provides the additional emitter resistance R1 described above in conjunction with FIG. 4. The value of the resistance R1 in a particular CMOS device is a function of the resistivity of the P⁺ thinox region 220 and the distance of the source of the corresponding p-channel device from the actual connection of the P⁺ thinox region 220 to $V_{DD}$. In one embodiment of the invention, the P⁺ thinox region has a sheet resistance of about 50 to 100 ohms/square, although other suitable resistance values could also be used. The ends 280, 282 and 284 of the P⁺ thinox region 220 extend outward to provide connection to other p-channel FETS (not shown) in integrated circuit 200. The additional emitter resistance provided for a given parasitic bipolar will generally depend on the length L of the P⁺ thinox region through which the supply voltage is routed before reaching the source region of the corresponding p-channel FET. In this example, metallization 216 provides a connection between $V_{DD}$ and the thinox region 220 via contact window 214. The first p-channel FET, made up of regions 223 and 224, will have less additional parasitic emitter resistance than the second p-channel FET, made up of regions 221 and 222, because of the additional length of thinox region 220 through which $V_{DD}$ is routed before reaching the second FET. Of course, the connection between the P⁺ thinox region 220 and $V_{DD}$ may be made at any suitable location in device 200 which allows sufficient additional parasitic emitter resistance to be added to each P⁺ source. Those skilled in the art can readily determine suitable dimensions, materials and other parameters for the region 220 to provide an increase in parasitic emitter resistance for a given application.

It should be apparent that many alternative routings of $V_{DD}$ may be used to increase the parasitic emitter resistance and thereby provide latch-up immunity in CMOS device 200. In other embodiments, the voltage supply $V_{SS}$ may be routed in a similar manner, either instead of or in addition to the routing of $V_{DD}$. The device 200 may be constructed in a well-known manner using any of a number of suitable materials. These and other details regarding the implementation and operation of device 200 will be readily apparent to those skilled in the art.

Other alternative embodiments of the invention may route a supply voltage input through different routing means, including, for example, an N⁺ region in a p-well CMOS device. In such an embodiment, the N⁺ routing means may form a source region or other active terminal of an n-channel FET, and may be connected to a $V_{SS}$ supply voltage input. It should be understood that both $V_{DD}$ and $V_{SS}$ are referred to herein as supply voltage inputs even though $V_{SS}$ in many applications is selected to be zero volts or ground potential. The supply voltages in accordance with the invention are therefore more generally referred to as voltage potentials, which should be understood herein include positive, negative or ground potentials.

TABLE 1 below shows exemplary measurements which demonstrate the improved latch-up performance of a CMOS device in accordance with the present invention. The number of connected cells in an exemplary CMOS memory cell device was varied and the corresponding holding voltage $V_H$ was measured. The number of connected cells corresponds to, for example, the length of a word line in an SRAM device. The holding voltage $V_H$ generally refers to the input voltage which is required to sustain a latch-up condition. An increase in $V_H$ therefore corresponds to an increased immunity to latch-up. It should be noted that if the holding voltage $V_H$ is greater than the device supply voltage, a latch-up condition generally cannot be sustained in the device and the device structure is therefore considered latch-up free. A cell in this example is assumed to include two p-channel FETs and two n-channel FETs as in the portion 210 of device 200 shown in FIG. 5.

TABLE 1 shows the measured values of $V_H$ at temperatures of 28° C. and 125° C. for different numbers of cells. It should be noted that in a conventional SRAM memory device design, increasing the number of cells would generally be expected to increase the value of the resistor $R_S$ shown in the schematic of FIG. 2 and therefore render the device more susceptible to latch-up. In a device constructed in accordance with the teachings of the present invention, however, increasing the number of connected cells from 4 to 24 actually increases $V_H$ from 3.2 volts to 7.8 volts at 28° C. and from 2.2 volts to 5.2 volts at 125° C. This increased immunity to latch-up is the result of routing $V_{DD}$ to the p-channel devices through a region of semiconductor material in the manner previously described.

TABLE 1

| No. of Cells | Holding Voltage $V_H$ | |
|---|---|---|
| | 28° C. | 125° C. |
| 4 | 3.2 | 2.2 |
| 8 | 4.6 | 3.0 |
| 12 | 5.8 | 3.5 |
| 16 | 6.6 | 4.4 |
| 20 | 7.2 | 4.7 |
| 24 | 7.8 | 5.2 |

The performance improvements provided by the present invention can be estimated by connecting an additional parasitic emitter resistance $R_E$ externally in an exemplary CMOS device. TABLE 2 shows the resulting measurements of holding voltage $V_H$ for different values of external resistance at 28° C. and 125° C. It can be seen that increases in $R_E$ generally result in increases in $V_H$ and therefore improved latch-up immunity. The CMOS device in which these measurements were made had a distance between the N$^+$ regions and the n-well of about 1.2 μm, and a distance between the P$^+$ regions and the n-well of about 1.3 μm. It should be noted that the effect of the series resistance will also be influenced by interaction with the n-well resistance and therefore the values shown should be understood as intended to illustrate general trends in $V_H$ rather than as values suitable for use in a particular application. As noted above, those skilled in the art will be able to determine appropriate routing arrangements and resistance values to provide the desired latch-up immunity in a given application.

TABLE 2

| Temp. | $R_E$ (ohms) | | | | | |
|---|---|---|---|---|---|---|
| | 0 | 100 | 200 | 500 | 1000 | 2000 |
| 28° C. | 1.65 | 2.1 | 2.3 | 3.8 | 6.0 | 12.8 |
| 125° C. | 1.26 | 1.61 | 2.0 | 3.0 | 4.8 | 8.2 |

A presently preferred embodiment of the invention has been described above. Many variations may be made in the arrangements shown. For example, although the invention has been illustrated in an n-well CMOS device using a P$^+$ thinox region to route $V_{DD}$, those skilled in the art could readily adapt the invention for use in a p-well CMOS device as well as in numerous other semiconductor devices in which the action of parasitic elements causes undesirable effects. In a p-well CMOS device, the routing means could include an N$^+$ active region used to route $V_{SS}$ or $V_{DD}$ supply voltages. In either p-well or n-well CMOS devices, both $V_{DD}$ and $V_{SS}$ supply voltages could be routed through active P$^+$ or N$^+$ thinox regions in accordance with the invention. Other alternative embodiments may utilize a routing means comprising, for example, a polysilicon region or a region of conductive material having a suitable resistivity. The routing means may form a portion of the source region or other terminal of a transistor in the device, or may be in contact with the source region or other terminal. These and other alternatives and variations in the arrangements shown will be readily apparent to those skilled in the art.

I claim:

1. A latch-up resistant semiconductor device comprising:
   a first region of semiconductor material of a first conductivity type;
   a well of semiconductor material formed in the first region and having a second conductivity type opposite to the first conductivity type;
   a first transistor formed in the well and including a source region and a drain region formed of semiconductor material of the first conductivity type;
   a second transistor formed in the first region and having a source region and a drain region formed of semiconductor material of the second conductivity type; and
   routing means connected between the source region of one of the first and second transistors and a corresponding voltage supply input of the device, wherein the routing means is formed of a semiconductor material having the same conductivity type as the source region to which the routing means is connected, said routing means creating an additional resistance limiting an emitter-base voltage drop across a parasitic transistor having an emitter connected through said routing means to the corresponding voltage supply input.

2. The device of claim 1 wherein the first region of semiconductor material having a first conductivity type further includes an epitaxial layer formed on a substrate, wherein the well is formed in the epitaxial layer.

3. The device of claim 1 wherein the device is a complementary MOS device and the first and second transistors are MOS field effect transistors.

4. The device of claim 1 wherein the first transistor is a p-channel transistor and the routing means further includes a P$^+$ region having a first end connected to a $V_{DD}$ voltage supply input and a second end in contact with the source region of the first transistor.

5. The device of claim 1 wherein the first transistor is a p-channel transistor and the source region of the p-channel first transistor is formed from a portion of the routing means.

6. The device of claim 1 wherein the first transistor is an n-channel transistor and the routing means further includes an N$^+$ region having a first end connected to a $V_{SS}$ supply voltage input and a second end in contact with the source region of the first MOS transistor.

7. The device of claim 1 wherein the first transistor is an n-channel transistor and the source region of the n-channel first transistor is formed from a portion of the routing means.

8. The device of claim 1 wherein the routing means includes a semiconductor material having a sheet resistance of about 50 to 100 ohms/square.

9. The device of claim 1 wherein the first transistor is a p-channel transistor, the second transistor is an n-channel transistor, and the routing means further includes a P$^+$ region having at least one contact window for connecting the routing means to the voltage supply input, and further wherein a portion of the P$^+$ region forms the source region of the p-channel transistor.

10. The device of claim 1 wherein the semiconductor device is an SRAM device and the routing means interconnects a plurality of memory cells in a word line of the SRAM device, one of the cells including the first and second transistors.

11. In a semiconductor device which includes a first region of semiconductor material of a first conductivity type, a well of semiconductor material formed in the first region and having a second conductivity type opposite to the first conductivity type, and a first transistor formed in the well and including a source region and a drain region formed of semiconductor material of the first conductivity type, a method of providing latch-up immunity including the steps of:

providing a second transistor formed in the first region and having a source region and a drain region formed of semiconductor material of the second conductivity type; and connecting a voltage supply input of the device to the source region of one of the first and the second transistors through a second region of semiconductor material, the second region having the same conductivity type as the source region to which the voltage supply input is connected, thereby creating an additional resistance limiting an emitter-base voltage drop across a parasitic transistor having an emitter connected through said second region of semiconductor material to the voltage supply input.

12. The method of claim 11 wherein the device is a complementary MOS device and the first and second transistors are MOS field effect transistors.

13. The method of claim 11 wherein the first transistor is a p-channel transistor and wherein the step of connecting the voltage supply input through a second region further includes routing a $V_{DD}$ voltage supply input through a $P^+$ region having a first end connected to the $V_{DD}$ supply voltage input and a second end in contact with the source region of the first transistor.

14. The method of claim 13 further including the step of forming the source region of the p-channel first transistor from a portion of the $P^+$ region.

15. The method of claim 11 wherein the first transistor is an n-channel transistor and wherein the step of connecting the voltage supply input through a second region further includes routing a $V_{SS}$ voltage supply input through an $N^+$ region having a first end connected to the $V_{SS}$ voltage supply input and a second end in contact with the source region of the first transistor.

16. The method of claim 15 further including the step of forming the source region of the n-channel first transistor from a portion of the $N^+$ region.

17. The method of claim 11 wherein the step of connecting the voltage supply input further includes routing the voltage supply input through a semiconductor material having a sheet resistance of about 50 to 100 ohms/square.

18. The method of claim 11 wherein the first transistor is a p-channel transistor, the second transistor is an n-channel transistor, and further wherein the step of connecting the voltage supply input through a second region further includes providing a $P^+$ region having at least one contact window for connecting a $V_{DD}$ voltage supply input to the $P^+$ region, and wherein a portion of the $P^+$ region forms the source region of the p-channel transistor.

19. The method of claim 11 wherein the device is an SRAM device and the step of connecting the voltage supply input through a second region of semiconductor material further includes connecting the voltage supply input through the second region to a plurality of memory cells in a word line of the SRAM device, one of the cells including the first and second transistors.

20. A latch-up resistant semiconductor device comprising:
a MOS transistor having a source region and a drain region of a given conductivity type; and
an additional region of semiconductor material connected between the source region of the MOS transistor and a voltage supply input of the device, wherein the additional region of semiconductor material is of the same conductivity type as the MOS transistor, said additional region of semiconductor material creating an additional resistance limiting an emitter-base voltage drop across a parasitic transistor having an emitter connected through said additional region to the voltage supply input.

* * * * *